(12) United States Patent
Tsuji et al.

(10) Patent No.: US 9,018,093 B2
(45) Date of Patent: Apr. 28, 2015

(54) METHOD FOR FORMING LAYER CONSTITUTED BY REPEATED STACKED LAYERS

(71) Applicant: ASM IP Holding B.V., Almere (NL)

(72) Inventors: Naoto Tsuji, Tokyo (JP); Fumitaka Shoji, Kawasaki (JP)

(73) Assignee: ASM IP Holding B.V., Almere (NL)

( * ) Notice: Subject to any disclaimer, the term of this patent is extended or adjusted under 35 U.S.C. 154(b) by 28 days.

(21) Appl. No.: 13/749,878

(22) Filed: Jan. 25, 2013

(65) Prior Publication Data

US 2014/0213065 A1     Jul. 31, 2014

(51) Int. Cl.
| | |
|---|---|
| H01L 21/31 | (2006.01) |
| H01L 21/469 | (2006.01) |
| H01L 21/4763 | (2006.01) |
| H01L 21/02 | (2006.01) |
| H01L 21/311 | (2006.01) |
| H01L 21/3205 | (2006.01) |
| H01L 21/3213 | (2006.01) |
| C23C 16/30 | (2006.01) |
| C23C 16/455 | (2006.01) |

(52) U.S. Cl.
CPC .... H01L 21/02274 (2013.01); H01L 21/02164 (2013.01); H01L 21/0217 (2013.01); H01L 21/02211 (2013.01); H01L 21/31116 (2013.01); H01L 21/32055 (2013.01); H01L 21/32134 (2013.01); H01L 21/32137 (2013.01); C23C 16/30 (2013.01); C23C 16/45523 (2013.01); C23C 16/45557 (2013.01)

(58) Field of Classification Search
USPC ......... 438/624, 778, 787, 783, 791, 792, 909, 438/938; 257/E21.487, E21.113
See application file for complete search history.

(56) References Cited

U.S. PATENT DOCUMENTS

| | | | | |
|---|---|---|---|---|
| 5,306,946 | A * | 4/1994 | Yamamoto | 257/640 |
| 5,430,011 | A * | 7/1995 | Tanaka et al. | 505/193 |
| 6,375,312 | B1 * | 4/2002 | Ikeda et al. | 347/62 |
| 6,437,444 | B2 * | 8/2002 | Andideh | 257/760 |
| 6,503,826 | B1 * | 1/2003 | Oda | 438/624 |
| 6,531,193 | B2 * | 3/2003 | Fonash et al. | 427/579 |
| 7,393,765 | B2 * | 7/2008 | Hanawa et al. | 438/515 |
| 7,550,396 | B2 * | 6/2009 | Frohberg et al. | 438/757 |
| 2002/0094388 | A1 * | 7/2002 | Fonash et al. | 427/579 |
| 2003/0054670 | A1 * | 3/2003 | Wang et al. | 438/787 |
| 2005/0260850 | A1 | 11/2005 | Loke | |
| 2007/0212811 | A1 * | 9/2007 | Hanawa et al. | 438/104 |
| 2008/0203487 | A1 * | 8/2008 | Hohage et al. | 257/369 |
| 2011/0014795 | A1 | 1/2011 | Lee | |
| 2011/0236600 | A1 * | 9/2011 | Fox et al. | 427/579 |
| 2012/0322252 | A1 * | 12/2012 | Son et al. | 438/591 |
| 2013/0122712 | A1 * | 5/2013 | Kim et al. | 438/714 |

* cited by examiner

Primary Examiner — Scott B Geyer
(74) Attorney, Agent, or Firm — Snell & Wilmer LLP

(57) ABSTRACT

A method for forming a layer constituted by repeated stacked layers includes: forming a first layer and a second layer on a substrate under different deposition conditions to form a stacked layer, wherein the film stresses of the first and second layers are tensile or compressive and opposite to each other, and the wet etch rates of the first and second layers are at least 50 times different from each other; and repeating the above step to form a layer constituted by repeated stacked layers, wherein the deposition conditions for forming at least one stacked layer are different from those for forming another stacked layer.

17 Claims, 6 Drawing Sheets

METHOD FOR FORMING LAYER CONSTITUTED BY REPEATED STACKED LAYERS

BACKGROUND OF THE INVENTION

1. Field of the Invention

The present invention generally relates to a method for forming a thin-film stacked body, particularly to a method for forming a thin-film stacked body used for, e.g., three dimensional memory cells.

2. Description of the Related Art

Explosive growth of smartphones and tablet terminals is expected to drive the NAND flash memory market to become a 56-billion U.S. dollar market in 2014 compared to the 22-billion U.S. dollar market size in 2010. On the other hand, the price per unit memory size is likely to drop from 2 U.S. dollars per gigabyte in 2010 to 0.5 U.S. dollar per gigabyte in 2014. 64- to 128-gigabit products of the 2Xnm generation whose mass-production begins in 2011 or 2012 are considered feasible as an extension of conventional technology, while the new technology called "three-dimensional cell" may allow the market to drive down the cost of new T-bit NAND flash memories that are expected to be available in the future, at the same pace as before.

The 3-dimensional cell technology reduces the manufacturing cost by stacking memory cells on a chip instead of using the traditional single-layer structure. Stacking chips adds to cost proportional to the number of stacked layers, but 3-dimensional cell technology can minimize the cost increase even when the number of layers is increased. As a result, this technology can dramatically reduce the cost per bit by allowing the number of layers to increase, while still permitting use of the old-generation microfabrication technology.

NAND flash memories based on the 3-dimensional cell technology are largely classified into two types. One is the "vertical channel (VC)" type where channels are arranged in the vertical direction, and the other is the "vertical gate (VG)" type where gate electrodes are arranged in the vertical direction. In the case of thin-film laminates, application to the VC type is being considered.

SUMMARY OF THE INVENTION

However, thin-film laminates applicable to three-dimensional cells are thick, typically having a total film thickness of 1 µm or more (such as 1.2 to 3 µm), which gives rise to a problem of film separation. In addition, the need to create internal cells through microfabrication makes it desirable for thin-film laminates to have a sufficiently high wet etching selectivity with respect to the two types of films constituting the layers, and also to have uniform film quality in the thickness direction.

An embodiment of the present invention is a method for manufacturing a thin-film laminate whereby a thin-film laminate constituted by one or more layered stacks, where each stack comprises two or more thin dielectric films of different film types, and is manufactured by continuously forming films on a substrate in the same chamber, wherein cases are included where the stresses of the dielectric films of different film types have opposite symbols, the overall stress of the thin-film laminate is adjusted to a range of −500 to 500 MPa, and the wet etching selectivity is set to 50 times or more. In addition, the surface roughness ($R_{RMS}$) of each of the dielectric films of different film types is set to 0.5 nm or less. Furthermore, as multiple stacks are layered on a substrate, the RF power is gradually increased and/or pressure is gradually decreased after one stack or several stacks, which achieves uniform film quality in the thickness direction to obtain a good etching shape.

Another embodiment of the present invention is a method for manufacturing a thin-film laminate whereby a thin-film laminate constituted by one or more layered stacks, where each stack comprises one or more thin dielectric films and one or more thin semiconductor films being layered together, and is manufactured by continuously forming films on a substrate in the same chamber, wherein cases are included where the stress of the dielectric film and stress of the semiconductor film have opposite symbols, the overall stress of the thin-film laminate is adjusted to a range of −500 to 500 MPa, and the wet etching selectivity is set to 50 times or more. In addition, the surface roughness ($R_{RMS}$) of each of the dielectric films is set to 0.5 nm or less. Furthermore, as multiple stacks are layered on a substrate, the RF power is gradually increased and/or pressure is gradually decreased after one stack or several stacks, which achieves uniform film quality in the thickness direction to obtain a good etching shape.

Any discussion of problems and solutions involved in the related art has been included in this disclosure solely for the purposes of providing a context for the present invention, and should not be taken as an admission that any or all of the discussion were known at the time the invention was made.

For purposes of summarizing aspects of the invention and the advantages achieved over the related art, certain objects and advantages of the invention are described in this disclosure. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the detailed description which follows.

BRIEF DESCRIPTION OF THE DRAWINGS

These and other features of this invention will now be described with reference to the drawings of preferred embodiments which are intended to illustrate and not to limit the invention. The drawings are greatly simplified for illustrative purposes and are not necessarily to scale.

DETAILED DESCRIPTION OF EMBODIMENTS

Figure 1:
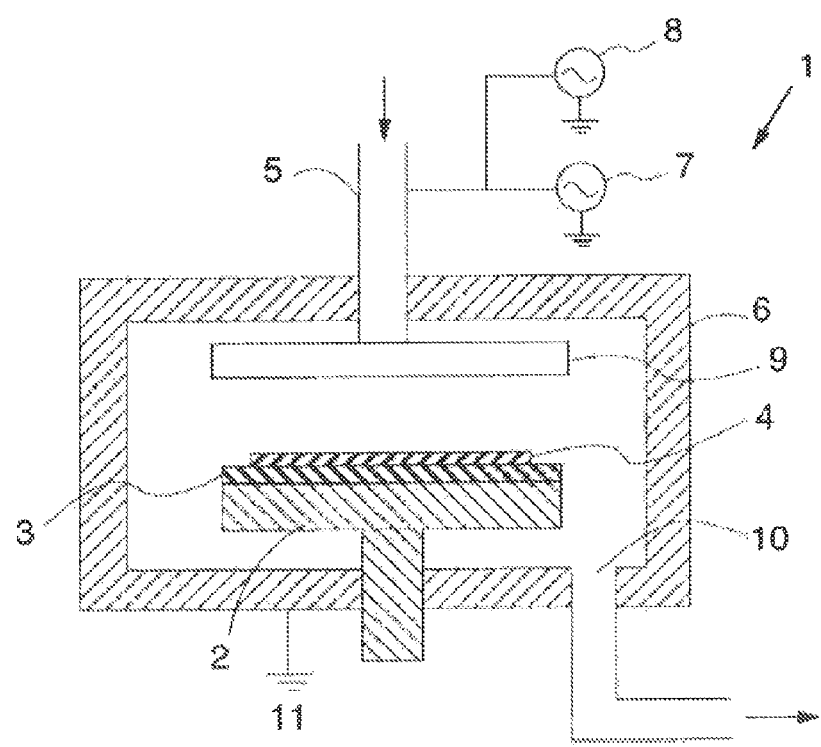
FIG. 1 is a schematic representation of a plasma CVD apparatus usable in an embodiment of the present invention.

In this disclosure, "gas" may include vaporized solid and/or liquid and may be constituted by a single gas or a mixture of gases. In this disclosure, the reactive gas, the additive gas, and the hydrogen-containing silicon precursor may be different from each other or mutually exclusive in terms of gas types, i.e., there is no overlap of gas types among these categories. Gases can be supplied in sequence with or without overlap. In some embodiments, "film" refers to a layer continuously extending in a direction perpendicular to a thickness direction substantially without pinholes to cover an entire target or concerned surface, or simply a layer covering a target or concerned surface. In some embodiments, "layer" refers to a structure having a certain thickness formed on a surface or a synonym of film. A film or layer may be constituted by a discrete single film or layer having certain characteristics or multiple films or layers, and a boundary between adjacent films or layers may or may not be clear and may be established based on physical, chemical, and/or any other characteristics, formation processes or sequence, and/or functions or purposes of the adjacent films or layers. In this disclosure, an article "a" or "an" refers to a species or a group of species (a genus including multiple species). Further, in this disclosure, any two numbers of a variable can constitute a workable range of the variable as the workable range can be determined based on routine work, and any ranges indicated may include or exclude the endpoints. Additionally, any values of variables indicated may refer to precise values or approximate values and include equivalents, and may refer to average, median, representative, majority, etc. in some embodiments.

In the present disclosure where conditions and/or structures are not specified, the skilled artisan in the art can readily provide such conditions and/or structures, in view of the present disclosure, as a matter of routine experimentation.

In all of the disclosed embodiments, any element used in an embodiment can be replaced with any elements equivalent thereto, including those explicitly, necessarily, or inherently disclosed herein, for the intended purposes. Further, the present invention can equally be applied to apparatuses and methods.

In this disclosure, any defined meanings do not necessarily exclude ordinary and customary meanings in some embodiments.

According to an embodiment, a method for forming a layer constituted by repeated stacked layers, comprises: (i) forming at least one first layer on a substrate under first conditions wherein the at least one first layer has a first film stress and a first wet etch rate; (ii) forming at least one second layer on the at least one first layer under second conditions wherein the at least one second layer has a second film stress and a second wet etch rate, wherein the first film stress and the second film stress are tensile or compressive and opposite to each other, and one of the first or second wet etch rate is at least 50 times higher (e.g., at least 100 times, at least 200 times) than the other of the first or second wet etch rate; and (iii) conducting at least steps (i) and (ii) multiple times to form a layer constituted by repeated stacked layers, each stacked layer comprising the at least one first layer and the at least one second layer and having the same layer structure. The first layer and the second layer are different films including (a) films having different bonds constituting a main skeleton of the films (e.g., Si—N bonds for a SiN film and Si—O bonds for a SiO film), (b) films, other than film (a), constituted by different compositions (e.g., a carbon-doped SiN film and a carbon-non-doped SiN film), or (c) films, other than film (a) or (b), having different crystalline or physical structures (e.g., an amorphous Si film and a polycrystalline Si film, or a compressive SiO film and a tensile SiO film). In some embodiments, the first and second layers are discrete films whose boundaries can be observed or detected (e.g., respective monolayers constituting a multi-element film formed by atomic layer deposition are integrated and thus do not constitute the first and second layers, although the multi-element film can be the first or second layer). Each stacked layer comprises the first layer and the second layer and has the same layer structure, wherein the stacked layer is the smallest repeating unit constituting the repeated stacked layers.

In some embodiments, each stacked layer has a thickness of about 20 nm to about 120 nm, each first layer and each second layer have preferably a thickness of more than 10 nm but no more than 60 nm, and the number of stacked layers is about 5 to about 100 (preferably about 10 to about 60).

In some embodiments, each first layer and each second layer have a surface roughness of about 0.5 nm or less. By forming a thin layer with a smooth surface, layers can be laminated with high integrity without lowering resistance to partial detaching or pealing. By controlling deposition pressure (e.g., under 500 Pa), for example, the surface roughness can be adjusted at about 0.5 nm or less.

In some embodiments, one of each first layer or each second layer is a dielectric layer (e.g., SiO film and SiOC film), and the other of each first layer or each second layer is a dielectric layer (e.g., SiN film and SiON film). Alternatively, one of each first layer or each second layer is a dielectric layer (e.g., SiO film, SiON film, and SiOC film), and the other of each first layer or each second layer is a semiconductor layer (e.g., amorphous Si film and poly Si film). A skilled artisan will appreciate that any other suitable combinations of layers can be employed.

In some embodiments, the repeated stacked layers are subjected to etching and then to removal of sacrificing layers which are either the first or second layers, in order to form a three-dimensional memory cell, for example. In some embodiments, each stacked layer (or stacked unit) is deposited on top of another to form the repeated stacked layers composed of tens to several tens of the stacked layers, reaching a thickness of about 2 μm. In order to stack evenly the stacked layers without lowering resistance to partial separation or partial pealing up to a thickness of about 2 μm, for example, the total film stress is desirably in a range of about −500 MPa to about 500 MPa. Further, when one of the first layers or the second layers is sacrificing layers to be removed, and the other is layers constituting functional structures of a device, it is desirable for the structure layers to have a compressive stress to a certain degree so as to improve the quality of the structure layers. Thus, in order to adjust the total film stress to about −500 MPa to 500 MPa (preferably −100 MPa to 100 MPa, more preferably −50 MPa to 50 MPa), it is desirable for the sacrificing layers to have a tensile stress, wherein the sacrificing layers and the structure layers are each deposited alternately.

In some embodiments, one of the at least one first layer or the at least one second layer, whichever has a higher wet etch rate, is at least one sacrificing layer. In some embodiments, the at least one first layer is one first layer and the at least one second layer is one second layer, wherein each stacked layer consists of the one first layer and the one second layer. In some embodiments, the stacked layer consists of the first and second layers and at least one other layer (typically one or two additional layers) which may be disposed underneath or on top of the first and second layers or intervening between the first and second layers.

In some embodiments, steps (i) to (iii) are conducted continuously. In the above, "continuously" refers to without breaking a vacuum, without interruption as a timeline, without changing treatment conditions, immediately thereafter, as a next step, or without a discrete physical or chemical boundary between two structures in some embodiments. In some embodiments, the first and second conditions for depositing the first and second layers are conditions for plasma-enhanced CVD (PECVD) or low-pressure CVD (LPCVD). Alternatively, the first and second layers can be deposited by atomic layer deposition (ALD). In some embodiments, steps (i) and (ii) can be conducted separately. For example, the first layers are deposited by LPCVD and the second layers are deposited by PECVD.

In some embodiments, film stress can be adjusted by manipulating RF power and/or pressure of a reaction chamber for PECVD, or by manipulating pressure, temperature, and/or flow rates for LPCVD.

Figure 3:
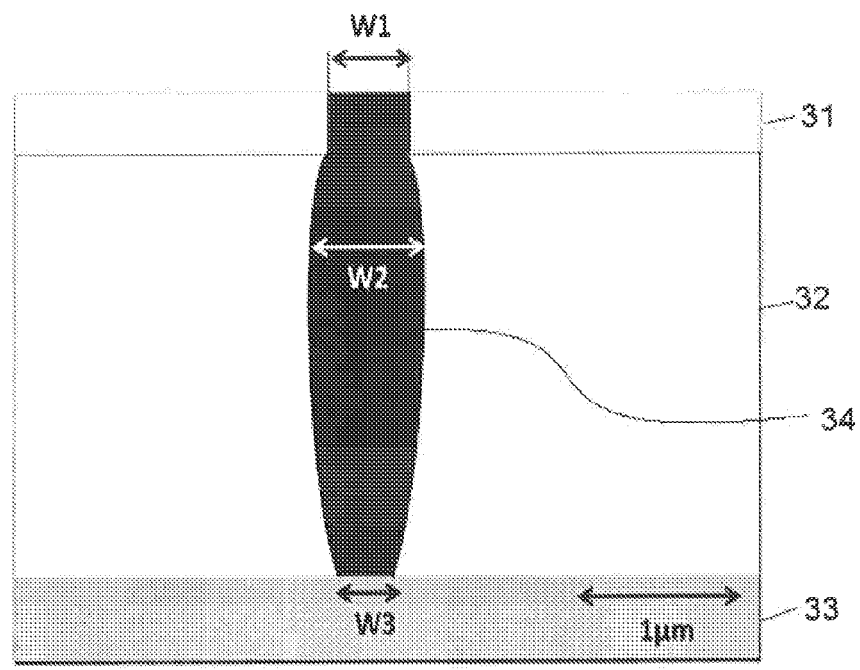
FIG. 3 is a schematic diagram illustrating a recess profile formed vertically through repeated stacked layers by etching.

In some embodiments, the first conditions and the second conditions for forming at least one of the stacked layers are different from the first conditions and the second conditions for forming other stacked layers. When continuously conducting steps (i) to (iii), the internal conditions of the reaction chamber may change with time. For example, unwanted film deposition occurs on an inner wall of the reaction chamber and a film accumulates as deposition progresses, affecting plasma discharge. The changes in the internal conditions of the reaction chamber with progress of the deposition steps affect not only film stress of the depositing stacked layers but also etching properties of the layers. In some embodiments, the changes contribute to improving the total film stress of the repeated stacked layers; however, the changes significantly affect etching properties of the stacked layers and impair the etched shape formed vertically throughout the repeated stacked layers. FIG. 3 is a schematic diagram illustrating a recess profile formed vertically through repeated stacked layers by etching. In the figure, repeated stacked layers 32 are formed on a substrate 33, and a hard mask 31 is formed on the repeated stacked layers 32. The repeated stacked layers 32 consist of 10 to 100 stacked layers which are omitted in this figure. The first and second layers have different etch rates (one of the first or second wet etch rate is at least 50 times higher than the other of the first or second wet etch rate), and thus, when the substrate is subjected to e.g., plasma etching, the layers having a higher etch rate are etched more quickly than the other layers having a lower etch rate. As a result, when both layers are etched by plasma etching to form a vertical recess, the inner surface of the recess forms an irregular profile or irregularities; however, the layers having a lower etch rate fill the concave portions while being etched, resulting in a surface which appears to be smooth and continuous. When an aspect ratio is high (e.g., 5 to 40, typically 10 or more), the repeated stacked layers typically develop a bowing shape (a middle part of the recess is wider than the top part of the recess) and a tapered shape (the bottom part of the recess is smaller than the top part of the recess) as illustrated in FIG. 3. The bowing and tapered shapes may be formed by anisotropic etching wherein ion emission becomes uneven at the opening, generating an electric discharge at the opening. The bowing and tapered shapes should be avoided because these uneven profiles impair subsequent wet etching processes. The bowing shape can be evaluated to be acceptable if W2/W1<1.10 and to be desirable if W2/W1<1.05 (typically W2/W1≥1.0), wherein W1 is the width (or cross sectional area) of the top part of the recess, and W2 is the width (or cross sectional area) of a middle part of the recess. The tapered shape can be evaluated to be acceptable if W3/W1>0.90 and to be desirable if W3/W1>0.95 (typically W3/W1≤1.0), wherein W3 is the width (or cross sectional area) of the bottom part of the recess.

In some embodiments, the first conditions and the second conditions for forming at least one of the stacked layers are different from the first conditions and the second conditions for forming other stacked layers in terms of RF power, pressure, temperature, and/or gas flow rate. By changing the deposition conditions per stacked layer or every n number of stacked layers (n is an integer of 2 to 10, for example), the recess profile can be tuned, and the bowing shape and the tapered shape can be ameliorated. In some embodiments, the conditions are for plasma-enhanced CVD, and the first conditions and the second conditions for forming at least one of the stacked layers are different from the first conditions and the second conditions for forming other stacked layers in terms of RF power and/or pressure. In some embodiments, the RF power is gradually increased and/or the pressure is gradually decreased after each stacked layer is consecutively formed. In some embodiments, the RF power is gradually increased and/or the pressure is gradually decreased after every multiple stacked layers are consecutively formed. In some embodiments, the conditions are for plasma-enhanced CVD, and the RF power has a single frequency or combined frequencies. In some embodiments, RF power is comprised of first RF power having a frequency of more than 2 MHz (typically 10 MHz to 30 MHz) and second RF power having a frequency of no more than 2 MHz (typically 100 kHz to 500 kHz). Also, in some embodiments, the substrate is controlled at a temperature of about 300° C. to about 600° C. (typically about 350° C. to about 550° C.).

In another aspect, an embodiment which provides a method for forming a layer constituted by repeated stacked layers includes: (a) forming a first layer and a second layer on a substrate under different deposition conditions to form a stacked layer, wherein film stresses of the first and second layers are tensile or compressive and opposite to each other, and wet etch rates of the first and second layers are at least 50 times different from each other; and (b) repeating step (a) to form a layer constituted by repeated stacked layers, each stacked layer having the same layer structure, wherein the deposition conditions for forming at least one stacked layer are different from those for forming another stacked layer. Any of the foregoing embodiments disclosed herein can be applied to the above aspect.

The embodiments will be explained with respect to preferred embodiments. However, the present invention is not limited to the preferred embodiments.

An embodiment provides a method for manufacturing a thin-film laminate. This method is a method for manufacturing a thin-film laminate whereby a thin-film laminate is constituted by one or more layered stacks, where each stack comprises two or more thin dielectric films of different film types, and is manufactured by continuously forming films on a substrate in the same chamber, wherein cases are included where the stresses of the dielectric films of different film types have opposite symbols, the overall stress of the thin-film laminate is adjusted to a range of −500 to 500 MPa, and the wet etching selectivity is set to 50 times or more. In addition, the surface roughness ($R_{RMS}$) of each of the dielectric films of different film types is set to 0.5 nm or less.

An embodiment is a method for manufacturing a thin-film laminate whereby a thin-film laminate constituted by one or more layered stacks, where each stack comprises one or more thin dielectric films and one or more thin semiconductor films being layered together, and is manufactured by continuously forming films on a substrate in the same chamber, wherein cases are included where the stress of the dielectric film and stress of the semiconductor film have opposite symbols, the overall stress of the thin-film laminate is adjusted to a range of −500 to 500 MPa, and the wet etching selectivity is set to 50 times or more. In addition, the surface roughness ($R_{RMS}$) of each of the dielectric films and semiconductor films is set to 0.5 nm or less.

In an embodiment, as multiple stacks are layered on a substrate, the RF power is gradually increased and/or pressure is gradually decreased after one stack or several stacks, which achieves uniform film quality in the thickness direction to obtain a good etching shape.

EXAMPLE

An embodiment of the present invention will be explained with reference to the following example which is not intended to limit the present invention.

FIG. 1 shows a schematic representation of a plasma CVD apparatus used in the examples. This plasma CVD apparatus 1 comprises a vacuum (reaction) chamber 6, a first electrode 9 (showerhead) being provided at the top of the vacuum chamber 6 and insulated from the vacuum chamber 6, a second electrode 3 (susceptor) being provided inside the vacuum chamber 6 substantially parallel to the first electrode 9, and RF power sources 7 and 8 connected to the first electrode. The vacuum chamber 6 has an opening at its lower portion and comprises an exhaust port 10 (exhaust duct) connected to an exhaust pump not shown. Additionally, the vacuum chamber 6 is grounded at 11. The vacuum chamber 6 also has an opening (not shown) with a gate valve (not shown) on an inner side wall for wafer transfer. The first electrode 9 has a hollow structure, and an upper tubular portion comprises a gas inlet port 5 connected to a gas line (not shown). Additionally, on a bottom face of the first electrode, a shower plate is removably attached so that a jet of a source gas introduced from the gas inlet port 5 is emitted from the apertures toward the second electrode 3. The second electrode 3 is provided on a heater 2 which maintains the temperature of a substrate at 300° C. to 600° C., for example. The susceptor 3 is disposed substantially parallel to the showerhead 9 and holds a workpiece 4 placed on its upper surface. The workpiece 4 is placed on the susceptor 3. The inside of the vacuum chamber 6 is evacuated to a given pressure (typically 100 to 1,000 Pa) by an exhaust pump connected to the exhaust port 10.

A source gas is introduced from the gas inlet port 5 into the vacuum chamber 6, and at the same time, RF voltage (e.g., 27.12 MHz, typically 300 to 3,000 W; 400 MHz, typically 0 to 500 W) is applied to the first electrode 9 using the RF power source 7 (if necessary, RF voltage from the second RF power source 8, lower frequency, is applied to the first electrode 9 by overlaying it on the other). The second electrode 3 is grounded, or a given bias voltage is applied. As a result, discharge occurs between the first electrode 9 and the second electrode 3, and the source gas is converted to a plasma state. Thus, a plasma reaction field is formed in the vicinity of the workpiece 4, and a thin film is formed on a surface of the workpiece 4.

A type and properties of a thin film formed on the surface of the workpiece 4 can vary depending on a type and flow rate of a source gas, a temperature of a workpiece, a frequency and swing of RF voltage supplied from RF power sources 7 and 8, plasma spatial distribution, and electric potential distribution. A skilled artisan can select gases and determine deposition conditions depending on the target thin film based on this disclosure and routine work. A skilled artisan will appreciate that the apparatus includes one or more controller(s) (not shown) programmed or otherwise configured to cause the deposition and reactor cleaning processes described elsewhere herein to be conducted. The controller(s) are communicated with the various power sources, heating systems, pumps, robotics and gas flow controllers or valves of the reactor, as will be appreciated by the skilled artisan.

Example 1

Thin-film laminates or stacks (repeated stacked layers) consisting of two types of dielectric films were formed on a substrate (having a diameter of 300 mm) by adjusting a flow rate and pressure of each gas and RF power as indicated below using a plasma CVD apparatus illustrated in FIG. 1.

Example 1-1

In this example, SiO was selected as the first dielectric film and SiN, as the second dielectric film. Table 1 shows the process conditions for each film. The conditions here were selected to achieve a stress of around −50 MPa in a stacked state. As shown in Example 1-3, RF power and pressure are the two parameters having strong influence on stress.

TABLE 1

Process conditions for single layer film and film properties

| | Process Condition | | | | | | | | Film Property | | |
| --- | --- | --- | --- | --- | --- | --- | --- | --- | --- | --- | --- |
| Film | SiH4 [sccm] | NH3 [sccm] | N2O [slm] | N2 [slm] | Press. [Pa] | RF1 [W] | RF2 [W] | SUS [° C.] | Stress [MPa] | Wet E/R ratio | Surface Roughness $R_{RMS}$ (nm) |
| SiO | 150 | 0 | 3.0 | 0.0 | 200 | 300 | 100 | 450 | −134 | 1:200 | 0.4 |
| SiN | 350 | 200 | 0.0 | 10.0 | 500 | 1400 | 0 | 450 | 24 | | 0.45 |

RF1: 13.56 MHz;
RF2: 400 kHz

When a stack was formed by layering 50 nm of each of the films and its stress was measured, a value close to the design, or specifically −45 MPa, was achieved. In addition, the ratio of wet etching rates was 1:200 when hot phosphoric acid was used as the etchant, giving a selectivity of 200. Furthermore, the surface roughness ($R_{RMS}$) of each film was 0.5 nm or less.

Figure 2:
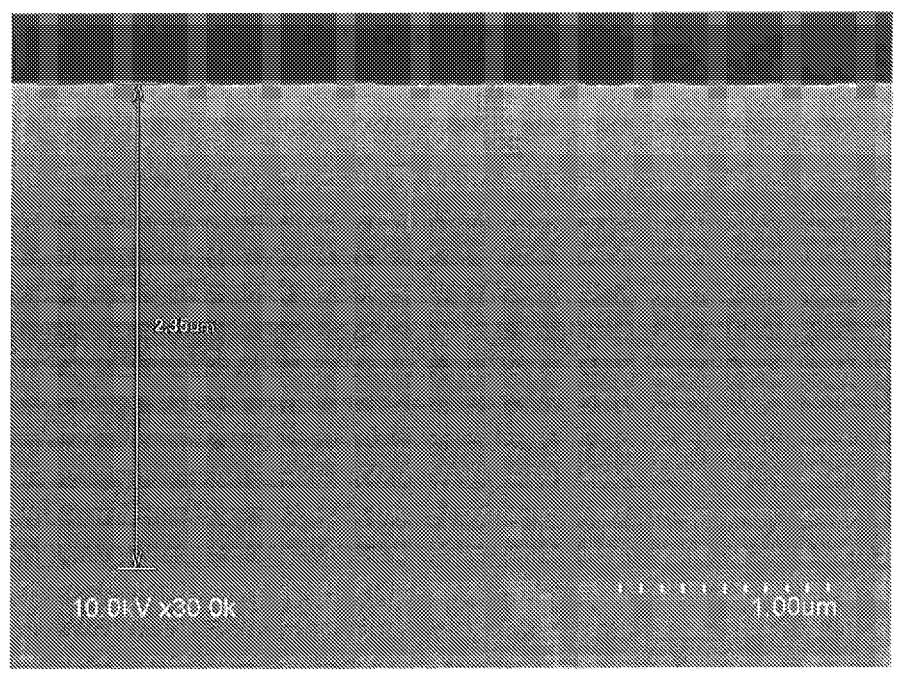
Fig. 2 is a cross section view observed using a SEM according to an embodiment of the present invention.
Figure 2A:
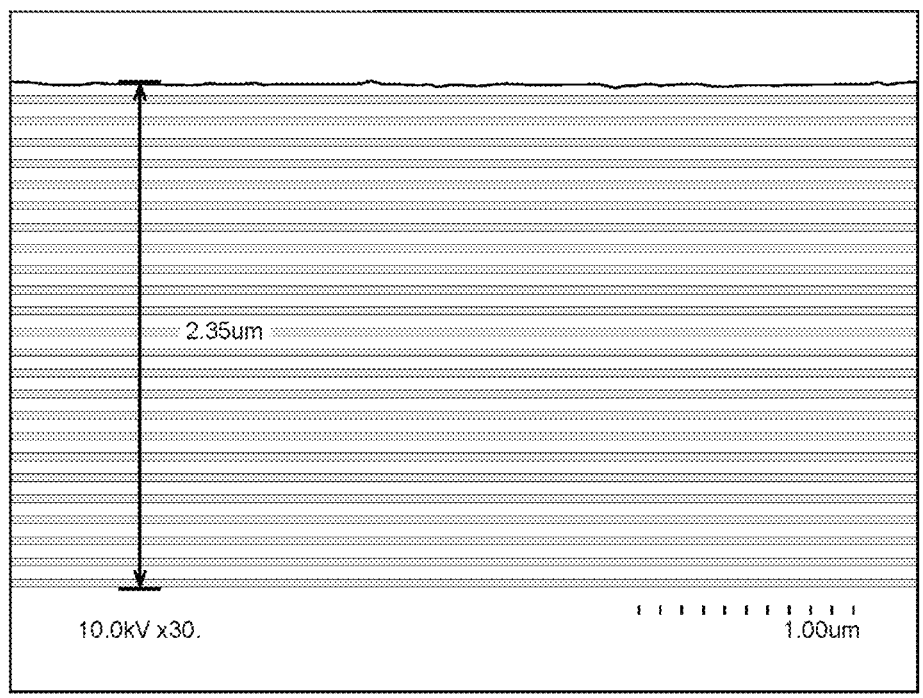
FIG. 2A is an illustrated version of FIG. 2.

When 24 stacks (48 layers) were layered under these conditions, 24 stacks were indeed observed in a SEM section image shown in FIG. 2.

Figure 4:
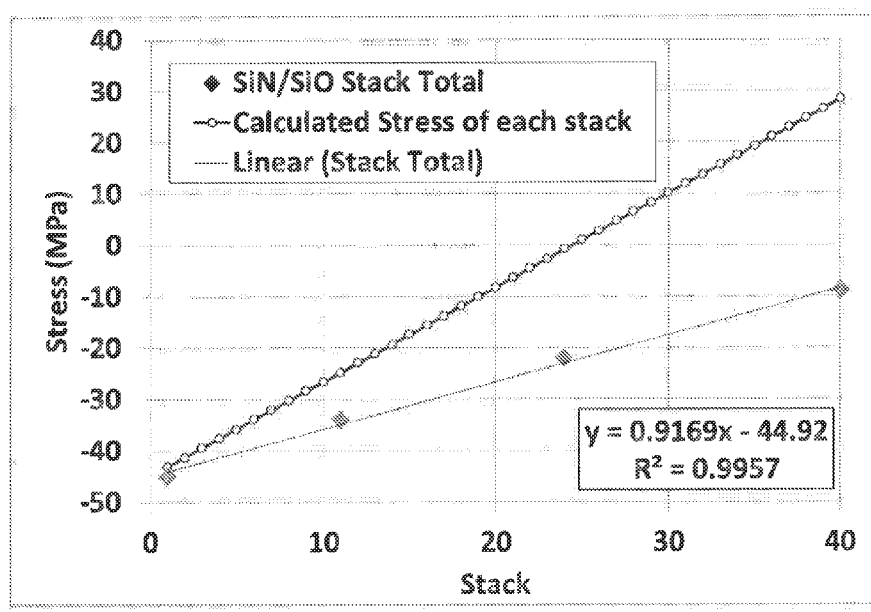
FIG. 4 is a graph demonstrating the relationship between film stress and the number of stacks, each stack consisting of a SiN layer and a SiO layer, according to an embodiment of the present invention.

Next, how stress changed as stacks were layered under the conditions in Table 1 was checked. FIG. 4 shows the results. Clearly film stress is strongly dependent on the number of stacks. In FIG. 4, "○" indicates the calculated stress of each stack, while "◊" indicates the measured stress of the stack. Since the total stress of the stacks represents the average of stresses of respective stacks, the calculated value was derived by approximating the measured value using a linear function (shown in the graph) and doubling the slope. As is evident from the figure, the measured total stress of the stacks decreases gradually compared to the calculated value as stacks are layered. This is probably due to change in the conditions inside the reaction chamber.

Example 1-2

Next, the 24-stack body obtained above was used to perform evaluation of RIE etching shape according to the evaluation method described below, by making holes under the RIE etching conditions described below. Normally, the bowing shape and tapered shape shown in FIG. 3 are obtained. When films of different types are layered, as is the case here, different etching rates result in a stepped profile. Since the etching rate of the SiO film is slower than the etching rate of the SiN film, SiO remained in the final structure and interpolated the concaved sections to create an appearance of smooth, continuous SiO, and as a result the profile shape shown in FIG. 3 was formed.

Etching conditions: CF4 200 sccm, O2 50 sccm, RF 800 W, susceptor 30° C., pressure 10 Pa Evaluation method: Shape evaluation was conducted according to the calculations described below. The passing condition is roughly W2/W1<1.10 for the bowing shape and W3/W1>0.90 for the tapered shape, but W2/W1<1.05 is desirable for the bowing shape and W3/W1>0.95, for the tapered shape. The target for W1 was set to 500 nm, but eventually the measured value was used instead.

The result was W2/W1=1.08 for the bowing shape and W3/W1=0.91 for the tapered shape, giving both shapes a "Pass" with a narrow margin.

Example 1-3

Next, each film was formed under the conditions shown in Table 2 to check the dependence of film stress on RF power and pressure. As is evident from Table 2, RF power and pressure are the two parameters having strong influence on film stress.

From Table 2, the dependence of RF power and pressure is as follows in the case of SiO:

RF2: −1.6 MPa/W((−210 MPa−(−50 MPa)/(150 W−50 W)=−1.6 MPa/W)

Pressure: +0.5 MPa/Pa((−120 MPa−(−140 MPa)/(220 Pa−180 Pa)=0.5 MPa/Pa)

The same relationship is as follows in the case of SiN:

RF1: −0.5 MPa/W((−95 MPa−(90 MPa)/(1600 W−1200 W)≈−0.5 MPa/W)

Pressure: +1.0 MPa/Pa((120 MPa−(−70 MPa)/(600 Pa−400 Pa)≈1.0 MPa/Pa)

Since the total stress of the stacks represents the average of stresses of respective stacks, a film having a desired film stress can be formed by adjusting the process conditions for each film according to the dependence obtained above.

Example 1-4

Next, an attempt was made to improve the etching shape by gradually increasing the RF power after each stack to achieve a stress of approx. −40 MPa after layering of 24 stacks. The RF power was changed in the process conditions as follows after each stack:

SiO: RF2(Ns)=100 W+1.1 W*(Ns−1)

SiN: RF1(Ns)=1400 W+3.6 W*(Ns−1), where, Ns=Nth stack (N=1 to 24).

When 24 stacks were layered under these conditions, the stress was −39 MPa, while the etching shape was W2/W1=1.04 for the bowing shape and W3/W1=0.96 for the tapered shape, indicating improvements in both stress and etching shape which were both in desired ranges. This proves that, by gradually changing the RF power after each stack or several stacks based on a certain function, the etching shape can be improved while keeping the film stress within a certain range.

Example 1-5

Next, an attempt was made to improve the etching shape by gradually decreasing the pressure after each stack to achieve a stress of approx. −40 MPa after layering of 24 stacks. The pressure was changed in the process conditions as follows after each stack:

SiO: Press(Ns)=200 Pa−3.6 Pa*(Ns−1)

SiN: Press(Ns)=500 Pa−1.8 Pa*(Ns−1), where, Ns=Nth stack (N=1 to 24).

When 24 stacks were layered under these conditions, the stress was −48 MPa, while the etching shape was W2/W1=1.03 for the bowing shape and W3/W1=0.97 for the tapered shape, indicating improvements in both stress and etching shape which were both in desired ranges. This proves that, by gradually changing the film-forming pressure (or film-forming pressure and RF power, etc.) after each stack or several stacks based on a certain function, the etching shape can be improved while keeping the film stress within a certain range.

TABLE 2

Parameter-dependency of film stress

| Film | Process Condition | | | | | | | | Film Property |
|---|---|---|---|---|---|---|---|---|---|
| | SiH4 [sccm] | NH3 [sccm] | N2O [slm] | N2 [slm] | Press. [Pa] | RF1 [W] | RF2 [W] | SUS [° C.] | Stress [MPa] |
| SiO (Ex. 1-1) | 150 | 0 | 3.0 | 0.0 | 200 | 300 | 100 | 450 | −134 |
| SiO | 150 | 0 | 3.0 | 0.0 | 200 | 300 | 50 | 450 | −50 |
| SiO | 150 | 0 | 3.0 | 0.0 | 200 | 300 | 150 | 450 | −210 |
| SiO | 150 | 0 | 3.0 | 0.0 | 180 | 300 | 100 | 450 | −140 |
| SiO | 150 | 0 | 3.0 | 0.0 | 220 | 300 | 100 | 450 | −120 |
| SiN (Ex. 1-1) | 350 | 200 | 0.0 | 10.0 | 500 | 1400 | 0 | 450 | 24 |
| SiN | 350 | 200 | 0.0 | 10.0 | 500 | 1200 | 0 | 450 | 90 |
| SiN | 350 | 200 | 0.0 | 10.0 | 500 | 1600 | 0 | 450 | −95 |
| SiN | 350 | 200 | 0.0 | 10.0 | 400 | 1400 | 0 | 450 | −70 |
| SiN | 350 | 200 | 0.0 | 10.0 | 600 | 1400 | 0 | 450 | 120 |

Example 2

Thin-film laminates or stacks (repeated stacked layers) consisting of a dielectric film and a semiconductor film were formed on a substrate (having a diameter of 300 mm) by adjusting a flow rate and pressure of each gas and RF power as indicated below using a plasma CVD apparatus illustrated in FIG. 1.

Example 2-1

In this example, SiO was selected as the dielectric film and a-Si, as the semiconductor film. The process conditions for each film are shown in Table 3. The conditions here were selected to achieve a stress of around −50 MPa in a stacked state. As shown in Example 1-3, RF power and pressure are the two parameters having strong influence on stress.

TABLE 3

Process conditions for single layer film and film properties

| | Process Condition | | | | | | | Film Property | | |
|---|---|---|---|---|---|---|---|---|---|---|
| Film | SiH4 [sccm] | N2O [slm] | He [slm] | Press. [Pa] | RF1 [W] | RF2 [W] | SUS [° C.] | Stress [MPa] | Wet E/R ratio | Surface Roughness $R_{RMS}$ (nm) |
| SiO | 150 | 3.0 | 0.0 | 200 | 300 | 100 | 450 | −134 | 1:220 | 0.4 |
| a-Si | 300 | 0.0 | 2.0 | 800 | 200 | 0 | 450 | 46 | | 0.35 |

RF1:13.56 MHz; RF2: 400 kHz

The process conditions and film properties for SiO are the same as those in Example 1. When a stack was formed by layering 50 nm of each of the films and its stress was measured, a value close to the design, or specifically −35 MPa, was achieved. In addition, the ratio of wet etching rates was 1:220 when a mixed acid comprising hydrofluoric acid, nitric acid and acetic acid was used as the etchant, giving a selectivity of 220. Furthermore, the surface roughness ($R_{RMS}$) of each film was 0.5 nm or less.

Figure 5:
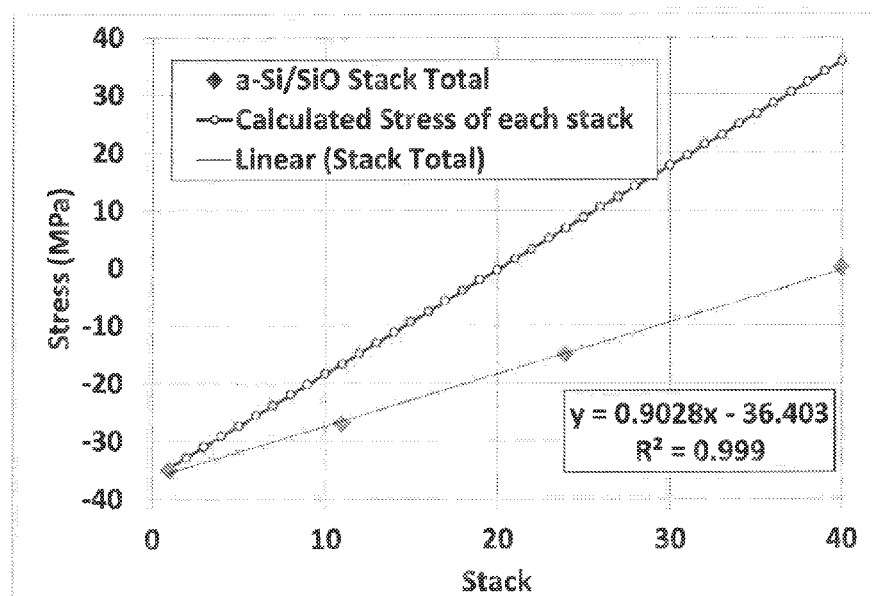
FIG. 5 is a graph demonstrating the relationship between film stress and the number of stacks, each stack consisting of an amorphous Si layer and a SiO layer, according to an embodiment of the present invention.

Next, how stress changed as stacks were layered under the conditions in Table 3 was checked. FIG. 5 shows the results. Clearly film stress is strongly dependent on the number of stacks. In FIG. 5, "○" indicates the calculated stress of each stack, while "◇" indicates the measured stress of the stack. Since the total stress of the stacks represents the average of stresses of respective stacks, the calculated value was derived by approximating the measured value using a linear function (shown in the graph) and doubling the slope. As is evident from the figure, the measured total stress of the stacks decreases gradually compared to the calculated value as stacks are layered. This is probably due to change in the conditions inside the reaction chamber.

Example 2-2

Next, the 24-stack body obtained above was used to perform evaluation of RIE etching shape according to the evaluation method described below, by making holes under the RIE etching conditions described below. Normally, the bowing shape and tapered shape shown in FIG. 3 are obtained. When films of different types are layered, as is the case here, different etching rates result in a stepped profile. Since the etching rate of the SiO film is slower than the etching rate of the a-Si film, SiO remained in the final structure and interpolated the concaved sections to create an appearance of smooth, continuous SiO, and as a result the profile shape shown in FIG. 3 was formed.

Etching conditions: CF4 200 sccm, O2 50 sccm, RF 800 W, susceptor 30° C., pressure 10 Pa Evaluation method: Shape evaluation was conducted according to the calculations described below. The passing condition is roughly W2/W1<1.10 for the bowing shape and W3/W1>0.90 for the tapered shape, but W2/W1<1.05 is desirable for the bowing shape and W3/W1>0.95, for the tapered shape. The target for W1 was set to 500 nm, but eventually the measured value was used instead.

The result was W2/W1=1.08 for the bowing shape and W3/W1=0.91 for the tapered shape, giving both shapes a "Pass" with a narrow margin.

Example 2-3

Next, each film was formed under the conditions shown in Table 4 to check the dependence of film stress on RF power and pressure. As evident from Table 4, RF power and pressure are the two parameters having strong influence on film stress.

TABLE 4

Parameter-dependency of film stress

| | Process Condition | | | | | | | Film Property |
|---|---|---|---|---|---|---|---|---|
| Film | SiH4 [sccm] | N2O [slm] | He [slm] | Press. [Pa] | RF1 [W] | RF2 [W] | SUS [° C.] | Stress [MPa] |
| SiO (Ex. 2-1) | 150 | 3.0 | 0.0 | 200 | 300 | 100 | 450 | −134 |
| SiO | 150 | 3.0 | 0.0 | 200 | 300 | 50 | 450 | −50 |
| SiO | 150 | 3.0 | 0.0 | 200 | 300 | 150 | 450 | −210 |
| SiO | 150 | 3.0 | 0.0 | 180 | 300 | 100 | 450 | −140 |
| SiO | 150 | 3.0 | 0.0 | 220 | 300 | 100 | 450 | −120 |
| a-Si (Ex. 2-1) | 300 | 0.0 | 2.0 | 800 | 200 | 0 | 450 | 46 |
| a-Si | 300 | 0.0 | 2.0 | 800 | 150 | 0 | 450 | 123 |
| a-Si | 300 | 0.0 | 2.0 | 800 | 250 | 0 | 450 | −34 |
| a-Si | 300 | 0.0 | 2.0 | 600 | 200 | 0 | 450 | −61 |
| a-Si | 300 | 0.0 | 2.0 | 1000 | 200 | 0 | 450 | 138 |

The process conditions and film properties for SiO are the same as those in Example 1. From Table 4, the dependence of RF power and pressure is as follows in the case of SiO:

RF2: −1.6 MPa/W((−210 MPa−(−50 MPa)/(150 W−50 W)=−1.6 MPa/W)

Pressure: +0.5 MPa/Pa((−120 MPa−(−140 MPa)/(220 Pa−1800 Pa)≈0.5 MPa/Pa)

The same relationship is as follows in the case of SiN:

RF1: −1.6 MPa/W((−34 MPa−(123 MPa)/(250 W−150 W)≈−1.6 MPa/W)

Pressure: +0.5 MPa/Pa((138 MPa−(−61 MPa)/(1000 Pa−600 Pa)≈0.5 MPa/Pa)

Since the total stress of the stacks represents the average of stresses of respective stacks, a film having a desired film stress can be formed by adjusting the process conditions for each film according to the dependence obtained above.

Example 2-4

Next, an attempt was made to improve the etching shape by gradually increasing the RF power after each stack to achieve a stress of approx. −40 MPa after layering of 24 stacks. The RF power was changed in the process conditions as follows after each stack:
SiO: RF2(Ns)=100 W+1.1 W×(Ns−1)
a-Si: RF1(Ns)=200 W+1.1 W×(Ns−1), where, Ns=Nth stack (N=1 to 24).
When 24 stacks were layered under these conditions, the stress was −25 MPa, while the etching shape was W2/W1=1.04 for the bowing shape and W3/W1=0.97 for the tapered shape, indicating improvements in both stress and etching shape which were both in desired ranges. This proves that, by gradually changing the RF power after each stack or several stacks based on a certain function, the etching shape can be improved while keeping the film stress within a certain range.

Example 2-5

Next, an attempt was made to improve the etching shape by gradually decreasing the pressure after each stack to achieve a stress of approx. −40 MPa after layering of 24 stacks. The pressure was changed in the process conditions as follows after each stack:
SiO: Press(Ns)=200 Pa−3.6 Pa×(Ns−1)
a-Si: Press(Ns)=800 Pa−3.6 Pa×(Ns−1), where, Ns=Nth stack (N=1 to 24).
When 24 stacks were layered under these conditions, the stress was −48 MPa, while the etching shape was W2/W1=1.03 for the bowing shape and W3/W1=0.96 for the tapered shape, indicating improvements in both stress and etching shape which were both in desired ranges. This proves that, by gradually changing the film-forming pressure (or film-forming pressure and RF power, etc.) after each stack or several stacks based on a certain function, the etching shape can be improved while keeping the film stress within a certain range.

Based on the above, according to an embodiment of the present invention a laminate can be formed which does not present separation or other problems when a device is formed, even when stacks, each comprising thin films including sacrificing films and films that form a device structure, are layered, and also a thin-film laminate can be provided which maintains a proper etching shape even when holes are made as a result of etching and prevents joining of holes in the device from forming process or other problems.

The present invention includes the above mentioned embodiments and other various embodiments including the following:

1) A method for manufacturing a thin-film laminate whereby a thin-film laminate constituted by one or more layered stacks, where each stack comprises two or more thin dielectric films of different film types, is manufactured by continuously forming films on a substrate in the same chamber; the method for manufacturing a thin-film laminate characterized in that the stresses of the two or more films have opposite symbols, the overall stress of the thin-film laminate is adjusted to near 0 MPa according to a stress adjustment method, and the wet etching selectivity is set to 50 times or more.

2) A method for manufacturing a thin-film laminate according to 1), characterized in that each stack is manufactured according to the plasma CVD method and/or LPCVD method.

3) A method for manufacturing a thin-film laminate according to 1) or 2), characterized in that the stress adjustment method involves adjustment of any one item or combination of two or more items selected from the group that includes RF power, pressure, temperature and gas flow rate ratio.

4) A method for manufacturing a thin-film laminate according to any one of 1) to 3), characterized in that, as multiple stacks are layered, the RF power is gradually increased and/or pressure is gradually decreased after each stack or several stacks.

5) A method for manufacturing a thin-film laminate according to any one of 1) to 4), characterized in that the etchant used in the wet etching is hot phosphoric acid.

6) A method for manufacturing a thin-film laminate according to any one of 1) to 5), characterized in that the surface roughness ($R_{RMS}$) of each of the dielectric films of different film types is 0.5 nm or less.

7) A method for manufacturing a thin-film laminate according to any one of 1) to 6), characterized in that the dielectric films of different film types are selected from the group that includes SiO, SiON, SiOC and SiN.

8) A method for manufacturing a thin-film laminate according to any one of 1) to 7), characterized in that the film thickness of each stack is 20 to 120 nm, each stack comprises films of two or more different film types where the film thickness of each dielectric film is over 0 nm but not more than 60 nm, and 5 to 60 stacks are layered together.

9) A method for manufacturing a thin-film laminate according to any one of 1) to 8), characterized in that under the plasma CVD method, a first RF and a second RF are superimposed and applied or a first RF is applied independently.

10) A method for manufacturing a thin-film laminate according to 9), characterized in that the first RF frequency is 2 MHz or more and the second RF frequency to be superimposed thereon is 2 MHz or less.

11) A method for manufacturing a thin-film laminate according to 9) or 10), characterized in that the first RF frequency is 10 to 30 MHz and the second RF frequency to be superimposed thereon is 100 to 500 kHz.

12) A method for manufacturing a thin-film laminate according to any one of 1 to 11), characterized in that the substrate temperature is set to a range of 300 to 600° C.

13) A method for manufacturing a thin-film laminate whereby a thin-film laminate is constituted by one or more layered stacks, where each stack comprises one or more thin dielectric films and one or more thin semiconductor films being layered together, is manufactured by continuously forming films on a substrate in the same chamber; the method for manufacturing a thin-film laminate characterized in that the stresses of two or more layers have opposite symbols, the overall stress of the thin-film laminate is adjusted to near 0 MPa according to a stress adjustment method, and the wet etching selectivity is set to 50 times or more.

14) A method for manufacturing a thin-film laminate according to 13), characterized in that each stack is manufactured according to the plasma CVD method and/or LPCVD method.

15) A method for manufacturing a thin-film laminate according to 13) or 14), characterized in that the stress adjustment method involves adjustment of any one item or combination of two or more items selected from the group that includes RF power, pressure, temperature, and gas flow rate ratio.

16) A method for manufacturing a thin-film laminate according to any one of 13) to 15), characterized in that, as multiple stacks are layered, the RF power is gradually increased and/or pressure is gradually decreased after each stack or several stacks.

17) A method for manufacturing a thin-film laminate according to any one of 13) to 16), characterized in that the etchant used in the wet etching is a mixed acid comprising any two or all of hydrofluoric acid, nitric acid, and acetic acid.

18) A method for manufacturing a thin-film laminate according to any one of 13) to 17), characterized in that the surface roughness ($R_{RMS}$) of each of the dielectric films of different film types is 0.5 nm or less.

19) A method for manufacturing a thin-film laminate according to any one of 13) to 18), characterized in that the dielectric films are selected from the group of film types that includes SiO, SiON, and SiOC.

20) A method for manufacturing a thin-film laminate according to any one of 13) to 18), characterized in that the semiconductor films are made of a-Si or poly-Si.

21) A method for manufacturing a thin-film laminate according to any one of 13) to 20), characterized in that the film thickness of each stack is 20 to 120 nm, each stack comprises dielectric films of 10 to 60 nm in film thickness and semiconductor films of 10 to 60 nm in film thickness, and 5 to 60 stacks are layered together.

22) A method for manufacturing a thin-film laminate according to any one of 13) to 21), characterized in that under the plasma CVD method, a first RF and a second RF are superimposed and applied or a first RF is applied independently.

23) A method for manufacturing a thin-film laminate according to 22), characterized in that the first RF frequency is 2 MHz or more and the second RF frequency to be superimposed thereon is 2 MHz or less.

24) A method for manufacturing a thin-film laminate according to 22) or 23), characterized in that the first RF frequency is 10 to 30 MHz and the second RF frequency to be superimposed thereon is 100 to 500 kHz.

25) A method for manufacturing a thin-film laminate according to any one of 13) to 24), characterized in that the substrate temperature is set to a range of 300 to 600° C.

It will be understood by those of skill in the art that numerous and various modifications can be made without departing from the spirit of the present invention. Therefore, it should be clearly understood that the forms of the present invention are illustrative only and are not intended to limit the scope of the present invention.

We claim:

1. A method for forming a layer constituted by repeated stacked layers, comprising:
   (i) forming at least one first layer on a substrate under first conditions wherein the at least one first layer has a first film stress and a first wet etch rate;
   (ii) forming at least one second layer on the at least one first layer under second conditions wherein the at least one second layer has a second film stress and a second wet etch rate, wherein the first film stress and the second film stress are tensile or compressive and opposite to each other, and one of the first or second wet etch rate is at least 50 times higher than the other of the first or second wet etch rate; and
   (iii) conducting at least steps (i) and (ii) multiple times to form a layer constituted by repeated stacked layers, each stacked layer having the same thickness and an identical, repeating layer structure comprising the at least one first layer and the at least one second layer;
   wherein the first conditions and the second conditions for forming at least one of the stacked layers are different from the first conditions and the second conditions for forming other stacked layers;
   wherein one of the at least one first layer or the at least one second layer, whichever has a higher wet etch rate, is at least one sacrificing layer, wherein steps (i) to (iii) are conducted continuously, without breaking a vacuum.

2. The method according to claim 1, wherein each stacked layer consists of the one first layer and the one second layer.

3. The method according to claim 1, wherein the layer constituted by repeated stacked layers has a film stress in a range of −500 Pa to 500 Pa.

4. The method according to claim 3, wherein the layer constituted by repeated stacked layers has a film stress in a range of −50 Pa to 50 Pa.

5. The method according to claim 1, wherein the first conditions and the second conditions for forming at least one of the stacked layers are different from the first conditions and the second conditions for forming other stacked layers in terms of RF power, pressure, temperature, and/or gas flow rate.

6. The method according to claim 5, wherein the first and second conditions are conditions for plasma-enhanced CVD (PECVD) or low-pressure CVD (LPCVD).

7. The method according to claim 6, wherein the conditions are for plasma-enhanced CVD, and the first conditions and the second conditions for forming at least one of the stacked layers are different from the first conditions and the second conditions for forming other stacked layers in terms of RF power and/or pressure.

8. The method according to claim 7, wherein the RF power is gradually increased and/or the pressure is gradually decreased after each stacked layer is consecutively formed.

9. The method according to claim 7, wherein the RF power is gradually increased and/or the pressure is gradually decreased after every multiple stacked layers are consecutively formed.

10. The method according to claim 6, wherein the conditions are for plasma-enhanced CVD, and RF power has a single frequency or combined frequencies.

11. The method according to claim 10, wherein RF power is comprised of a first RF power having a frequency of more than 2 MHz and a second RF power having a frequency of no more than 2 MHz.

12. The method according to claim 1, wherein the substrate is controlled at a temperature of about 300° C. to about 600° C.

13. The method according to claim 1, wherein each stacked layer has a thickness of about 20 nm to about 120 nm, each first layer and each second layer have a thickness of no more than 60 nm, and the number of stacked layers is about 5 to about 60.

14. The method according to claim 1, wherein each first layer and each second layer have a snake roughness of about 0.5 nm or less.

15. The method according to claim 1, wherein one of each first layer or each second layer is a dielectric layer.

16. The method according to claim 15, wherein the other of each first layer or each second layer is a dielectric layer or a semiconductor layer.

17. A method for forming a layer constituted by repeated stacked layers includes:
- (a) forming a first layer and a second layer on a substrate under different deposition conditions to form a stacked layer, wherein film stresses of the first and second layers are tensile or compressive and opposite to each other, and wet etch rates of the first and second layers are at least 50 times different from each other; and
- (b) repeating step (a) to form a layer constituted by repeated stacked layers, each stacked layer having the same thickness and an identical, repeating layer structure comprising the first and second layers, wherein the deposition conditions for forming at least one stacked layer are different from those for forming another stacked layer;

wherein the first conditions and the second conditions for forming at least one of the stacked layers are different from the first conditions and the second conditions for forming other stacked layers;

wherein one of the at least one first layer or the at least one second layer, whichever has a higher wet etch rate, is at least one sacrificing layer, wherein steps (i) to (iii) are conducted continuously, without breaking a vacuum.

* * * * *